(12) United States Patent
Ker et al.

(10) Patent No.: US 7,826,187 B2
(45) Date of Patent: Nov. 2, 2010

(54) TRANSIENT DETECTION CIRCUIT

(75) Inventors: Ming-Dou Ker, Hsinchu (TW); Cheng-Cheng Yen, Hsinchu (TW); Chi-Sheng Liao, Hsinchu (TW); Tung-Yang Chen, Tainan County (TW)

(73) Assignees: Himax Technologies Limited, Sinshih Township, Tainan County (TW); National Chiao-Tung University, Hsinchu (TW)

( * ) Notice: Subject to any disclaimer, the term of this patent is extended or adjusted under 35 U.S.C. 154(b) by 365 days.

(21) Appl. No.: 12/107,902

(22) Filed: Apr. 23, 2008

(65) Prior Publication Data

US 2009/0267584 A1 Oct. 29, 2009

(51) Int. Cl.
*H02H 9/00* (2006.01)
(52) U.S. Cl. ......................................... 361/56
(58) Field of Classification Search .................. 361/56
See application file for complete search history.

(56) References Cited

U.S. PATENT DOCUMENTS

| | | | | |
|---|---|---|---|---|
| 5,255,146 A | * | 10/1993 | Miller | 361/56 |
| 5,559,659 A | * | 9/1996 | Strauss | 361/56 |
| 5,869,978 A | * | 2/1999 | Hong | 326/24 |
| 7,135,908 B2 | * | 11/2006 | Becker | 327/312 |
| 2007/0171587 A1 | * | 7/2007 | Lee et al. | 361/56 |

* cited by examiner

*Primary Examiner*—Ronald W Leja
(74) *Attorney, Agent, or Firm*—Thomas, Kayden, Horstemeyer & Risley

(57) ABSTRACT

A transient detection circuit coupled between a first power line and a second power line and including a first control unit, a setting unit, and a voltage regulation unit. The first control unit generates a first control signal. The first control signal is at a first level when an electrostatic discharge (ESD) event occurs. The first control signal is at a second level when the ESD event does not occur. The setting unit sets a first node. The first node is set at the second level when the first control signal is at the first level. The voltage regulation unit regulates the first node. The voltage regulation unit regulates the level of the first node at the second level when the first control signal is at the second level.

15 Claims, 6 Drawing Sheets

TRANSIENT DETECTION CIRCUIT

BACKGROUND OF THE INVENTION

1. Field of the Invention

The invention relates to a transient detection circuit, and more particularly to a transient detection circuit for detecting an electrostatic discharge (ESD).

2. Description of the Related Art

An electrostatic discharge (ESD) event is an important reliability issue for integrated circuits (ICs). To meet component-level ESD reliability, on-chip ESD protection circuits have been added to the I/O cells and power (VDD and VSS) cells of CMOS ICs. In addition to component-level ESD stress, a system-level ESD issue is an increasingly significant reliability issue for CMOS IC products. The issues result from strict reliability test standard requirements, such as system-level ESD tests for electromagnetic compatibility (EMC) regulation.

BRIEF SUMMARY OF THE INVENTION

Transient detection circuits are provided. An exemplary embodiment of a transient detection circuit, which is coupled between a first power line and a second power line, comprises a first control unit, a setting unit, and a voltage regulation unit. The first control unit generates a first control signal. The first control signal is at a first level when an electrostatic discharge (ESD) event occurs. The first control signal is at a second level when the ESD event does not occur. The setting unit sets a first node. The first node is set at the second level when the first control signal is at the first level. The voltage regulation unit regulates the first node. The voltage regulation unit regulates the level of the first node at the second level when the first control signal is at the second level.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
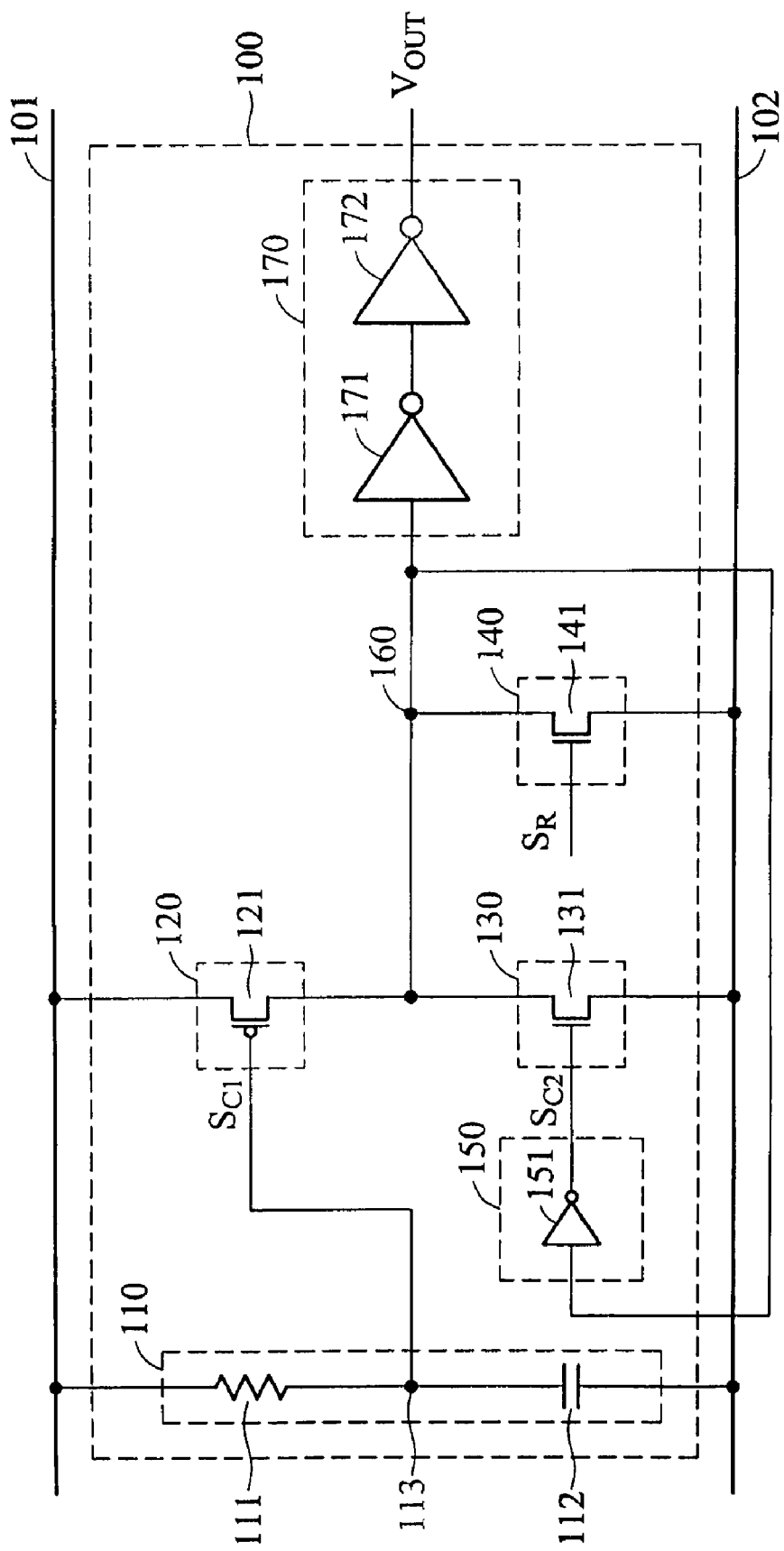
FIG. 1 is a schematic diagram of an exemplary embodiment of a transient detection circuit.

FIG. 1 is a schematic diagram of an exemplary embodiment of a transient detection circuit. The transient detection circuit 100 is coupled between power lines 101 and 102. The transient detection circuit 100 comprises a control unit 110, a setting unit 120, and a voltage regulation unit 130. The control unit 110 generates a control signal $S_{C1}$. When an electrostatic discharge (ESD) event occurs, the control signal $S_{C1}$ is at a first level. When the ESD event does not occur, the control signal $S_{C1}$ is at a second level. The first and the second levels are reversed. For example, when the first level is at a low level, the second level is at a high level. When the first level is at a high level, the second level is at a low level.

In this embodiment, the control unit 110 comprises a resistor 111 and a capacitor 112. The resistor 111 and the capacitor 112 are coupled to a node 113. The resistor 111 connects to the capacitor 112 in series between the power lines 101 and 102. The resistor 111 and the capacitor 112 define a delay constant. The delay constant exceeds the duration of an ESD pulse and is less than the initial rising time of a signal, wherein the signal is received by power line 101. Thus, the change of the control signal $S_{C1}$ is slower than the ESD pulse.

When an ESD event occurs in the power line 101 and the power line 102 is grounded, the node 113 is at a low level because the delay constant exceeds the duration of an ESD pulse. When the ESD event does not occur, if the level of the power line 101 is at a high level and the level of the power line 102 is at a low level, the node 113 is at the high level.

The setting unit 120 sets a node 160. When the control signal $S_{C1}$ is at the first level, the node 160 is set at the second level. In this embodiment, the setting unit 120 is a P-type transistor 121. The P-type transistor 121 comprises a gate coupled to the node 113, a source coupled to the power line 101, and a drain coupled to the node 160. When an ESD event occurs in the power line 101 and the power line 102 is grounded, the control signal $S_{C1}$ is at the low level. Thus, the P-type transistor 121 is turned on such that the node 160 is at the high level.

The voltage regulation unit 130 regulates the level of the node 160. When the control signal $S_{C1}$ is at the second level, the voltage regulation unit 130 regulates the level of the node 160. Thus, the level of the node 160 is at the second level. In this embodiment, the voltage regulation unit 130 is an N-type transistor 131. The N-type transistor 131 sets the level of the node 160 according to a control signal $S_{C2}$. The N-type transistor 131 comprises a gate receiving the control signal $S_{C2}$, a drain coupled to the node 160, and a source coupled to the power line 102. When the control signal $S_{C2}$ is at the high level, the level of the node 160 is at a low level.

The transient detection circuit 100 further comprises a control unit 150 for generating the control signal $S_{C2}$. The control unit 150 generates the control signal $S_{C2}$ to the voltage regulation unit 130 according to the level of the node 160. In this embodiment, the control unit 150 is an inverter 151. The inverter 151 inverts the level of the node 160 and provides the inverted result to serve as the control signal $S_{C2}$. When an ESD event occurs in the power line 101 and the power line 102 is grounded, the node 160 is at a high level. Thus, the control signal $S_{C2}$ is at a low level. Assuming that the ESD event does not occur, the level of the power line 101 is at a high level, and the level of the power line 102 is at a low level. If the control signal $S_{C2}$ is at a high level, the N-type transistor 131 is turned on for ensuring that the level of the node 160 is at the low level.

The transient detection circuit 100 further comprises a reset unit 140 for setting the level of the node 160 at the first level. In this embodiment, the reset unit 140 is an N-type transistor 141. The N-type transistor 141 comprises a gate receiving a reset signal $S_R$, a drain coupled to the node 160, and a source coupled to the power line 102. When an ESD event occurs in the power line 101 and the power line 102 is grounded, the node 160 is at a high level. Assuming that the ESD event does not occur, the level of the power line 101 is at a high level, and the level of the power line 102 is at a low level. If the reset signal $S_R$ is at a low level, the node 160 is maintained at the high level because the node 160 can not be discharged. If the reset signal $S_R$ is at a high level, the node 160 is changed from the high level to the low level.

A user can obtain whether an ESD event occurs according to the level of the node 160. In this embodiment, the transient detection circuit 100 further comprises a buffer module 170. The buffer module 170 processes the level of the node 160 for increasing the driving function of the level of the node 160. The processed result serves as an output signal $V_{OUT}$. The buffer module 170 comprises buffers 171 and 172. When the number of the buffers is numerous, the driving function of the output signal $V_{OUT}$ is larger. In another embodiment, the buffer module 170 is omitted.

Figure 2:
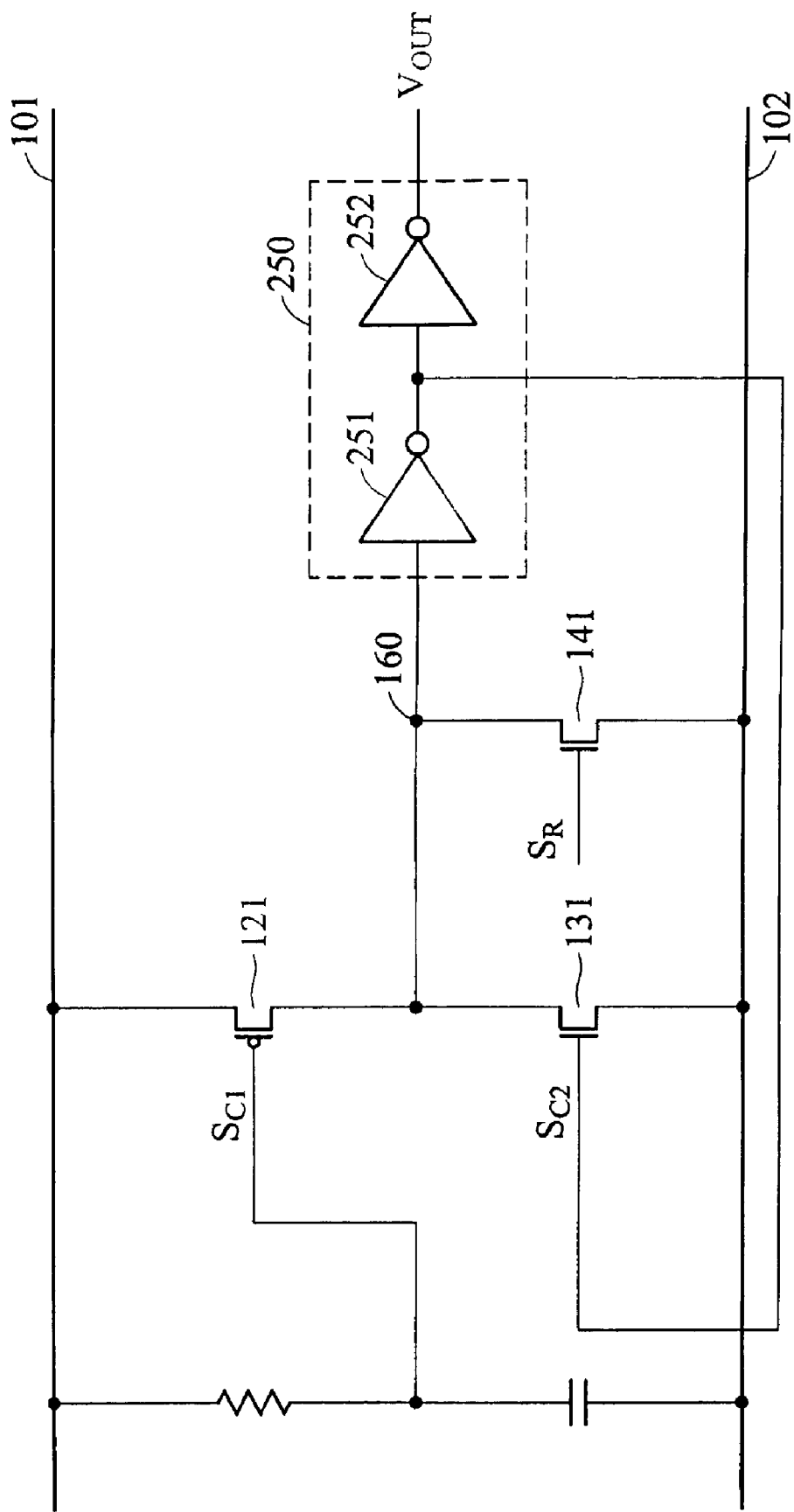
FIGS. 2-6 are schematic diagram of other exemplary embodiments of the transient detection circuit.

FIG. 2 is a schematic diagram of another exemplary embodiment of the transient detection circuit. FIG. 2 is similar to FIG. 1 with the exception that a control unit 250 comprises buffers 251 and 252. The buffer 251 receives the level of the node 160 and provides an output signal to serve as the control signal $S_{C2}$. The buffer 251 connects to the buffer 252 in series.

When an ESD event occurs in the power line 101 and the power line 102 is grounded, the node 160 is at a high level. Thus, the control signal $S_{C2}$ is at a low level. Assuming that the level of the power line 101 is at a high level and the level of the power line 102 is at a low level when ESD event does not occur, since the control signal $S_{C1}$ is at the high level, the P-type transistor 121 is turned off. At this time, if the reset signal $S_R$ is at the low level, the node 160 is at the high level due to the N-type transistors 131 and 141 being turned off. If the reset signal $S_R$ is at the high level, the node 160 is at the low level. Thus, the control signal $S_{C2}$ is at the high level such that the N-type transistor 131 is turned on for ensuring that the node 160 is at the low level.

Figure 3:
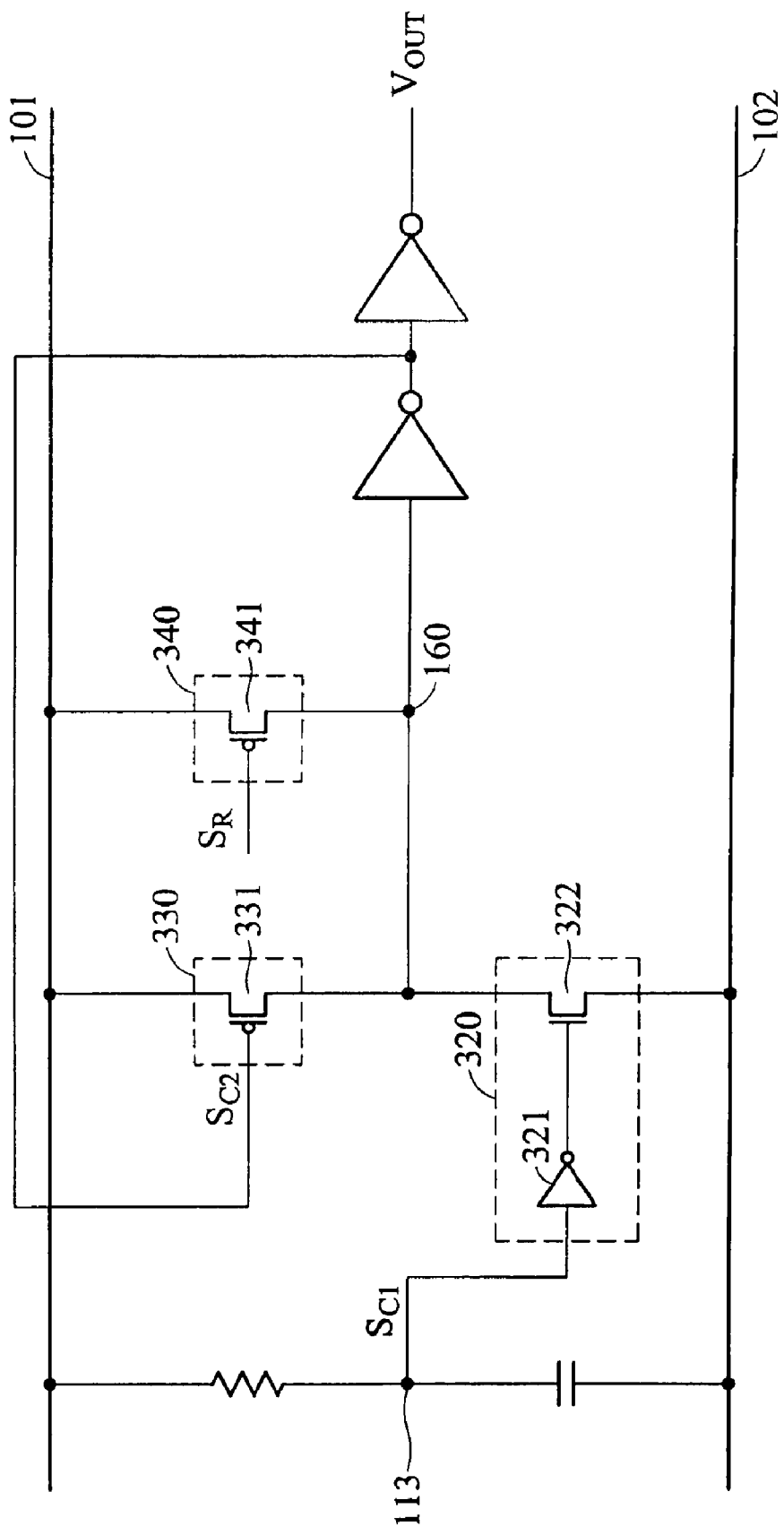

FIG. 3 is a schematic diagram of another exemplary embodiment of the transient detection circuit. The setting unit 320, the voltage regulation unit 330 and the reset unit 340 shown in FIG. 3 is different from FIG. 2. In this embodiment, the setting unit 320 comprises an inverter 321 and an N-type transistor 322. The input terminal of the inverter 321 is coupled to the node 113. The N-type transistor 322 comprises a gate coupled to the output terminal of the inverter 321, a source coupled to the power line 102, and a drain coupled to the node 160.

In this embodiment, the voltage regulation unit 330 is a P-type transistor 331 and the reset unit 340 is also a P-type transistor 341. The P-type transistor 331 sets the level of the node 160 according to the control signal $S_{C2}$. The P-type transistor 331 comprises a gate receiving the control signal $S_{C2}$, a source coupled to the power line 101, and a drain coupled to the node 160. The P-type transistor 341 comprises a gate receiving the reset signal $S_R$, a drain coupled to the node 160, and a source coupled to the power line 101.

Figure 4:
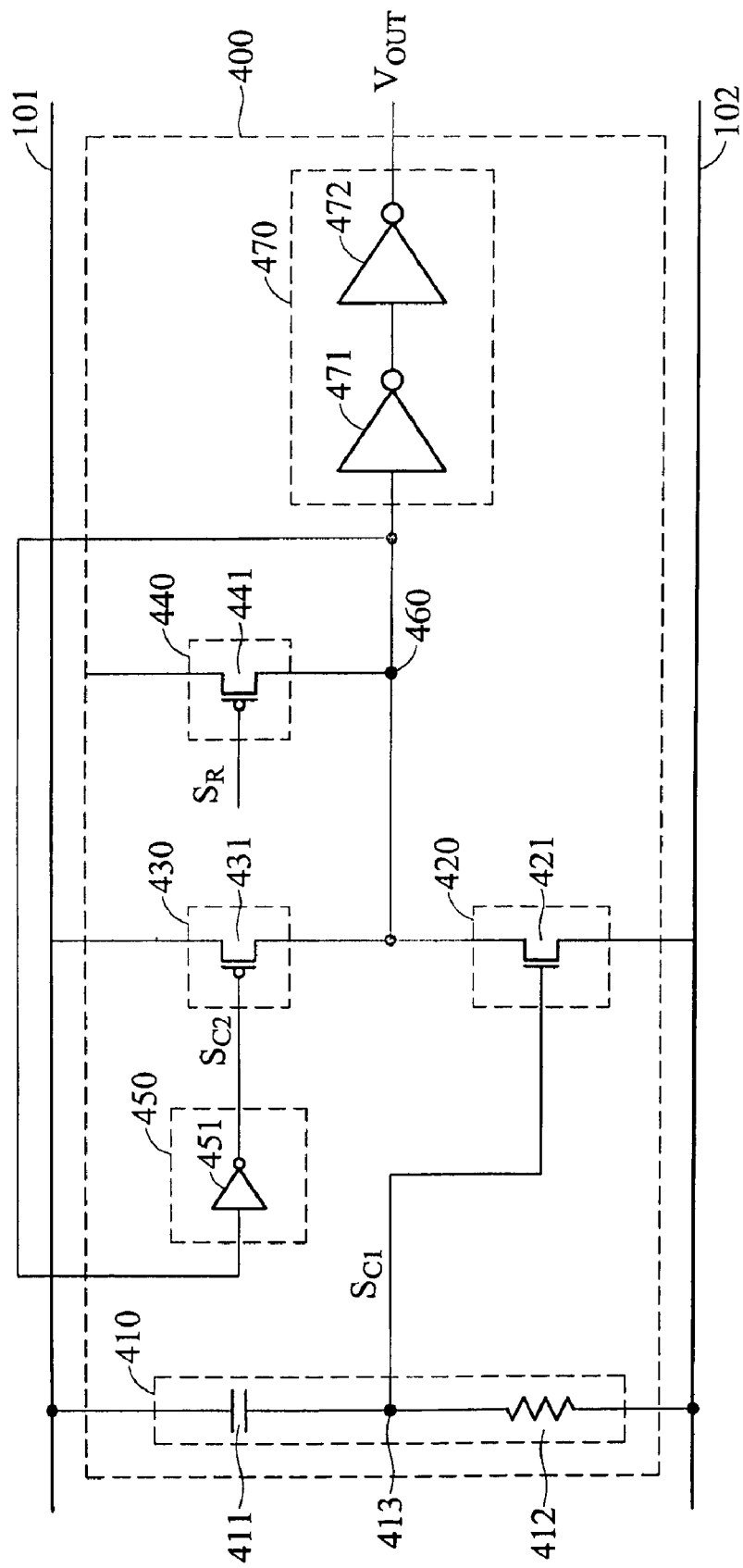

FIG. 4 is a schematic diagram of another exemplary embodiment of the transient detection circuit. The control unit 410 controls the change of the control signal $S_{C1}$ to be slower than the ESD pulse. In this embodiment, the control unit 410 comprises a capacitor 411 and a resistor 412. The capacitor 411 and the resistor 412 are coupled to a node 413. The capacitor 411 connects to the resistor 412 in series between the power lines 101 and 102. When an ESD event occurs in the power line 101 and the power line 102 is grounded, the control signal $S_{C1}$ is at a high level because of the characteristic of the capacitor 411. When the ESD event does not occur, if the level of the power line 101 is at a high level and the level of the power line 102 is at a low level, the control signal $S_{C1}$ is at the low level.

The setting unit 420 is an N-type transistor 421. The N-type transistor 421 comprises a gate coupled to the node 413, a source coupled to the power line 102, and a drain coupled to the node 460. When an ESD event occurs in the power line 101 and the power line 102 is grounded, the control signal $S_{C1}$ is at the high level. Thus, the N-type transistor 421 is turned on such that the node 460 is at the low level.

The voltage regulation unit 430 is a P-type transistor 431. The P-type transistor 431 sets the level of the node 460 according to the control signal $S_{C2}$. The P-type transistor 431 comprises a gate receiving the control signal $S_{C2}$, a drain coupled to the node 460, and a source coupled to the power line 101.

The control unit 450 is an inverter 451. The inverter 451 inverts the level of the node 460 and provides the inverted result to serve as the control signal $S_{C2}$. When an ESD event occurs in the power line 101 and the power line 102 is grounded, the node 460 is at a low level. Thus, the control signal $S_{C2}$ is at a high level. Assuming that the ESD event does not occur, the level of the power line 101 is at a high level, and the level of the power line 102 is at a low level. If the control signal $S_{C2}$ is at a low level, the P-type transistor 431 is turned on for ensuring the level of the node 460 at the high level.

The reset unit 440 is a P-type transistor 441. The P-type transistor 441 comprises a gate receiving a reset signal $S_R$, a drain coupled to the node 460, and a source coupled to the power line 101. When an ESD event occurs in the power line 101 and the power line 102 is grounded, the node 460 is at a low level. Assuming that the ESD event does not occur, the level of the power line 101 is at a high level, and the level of the power line 102 is at a low level. If the reset signal $S_R$ is at a high level, the node 460 is maintained at the low level because the node 460 can not be charged. If the reset signal $S_R$ is at a low level, the node 460 is changed from the low level to the high level.

In this embodiment, the transient detection circuit 400 further comprises a buffer module 470. The buffer module 470 processes the level of the node 460 for increasing the driving function of the level of the node 460. The processed result serves as an output signal $V_{OUT}$. The buffer module 470 comprises buffers 471 and 472. When the number of the buffers is numerous, the driving function of the output signal $V_{OUT}$ is larger. In another embodiment, the buffer module 470 is omitted.

Figure 5:
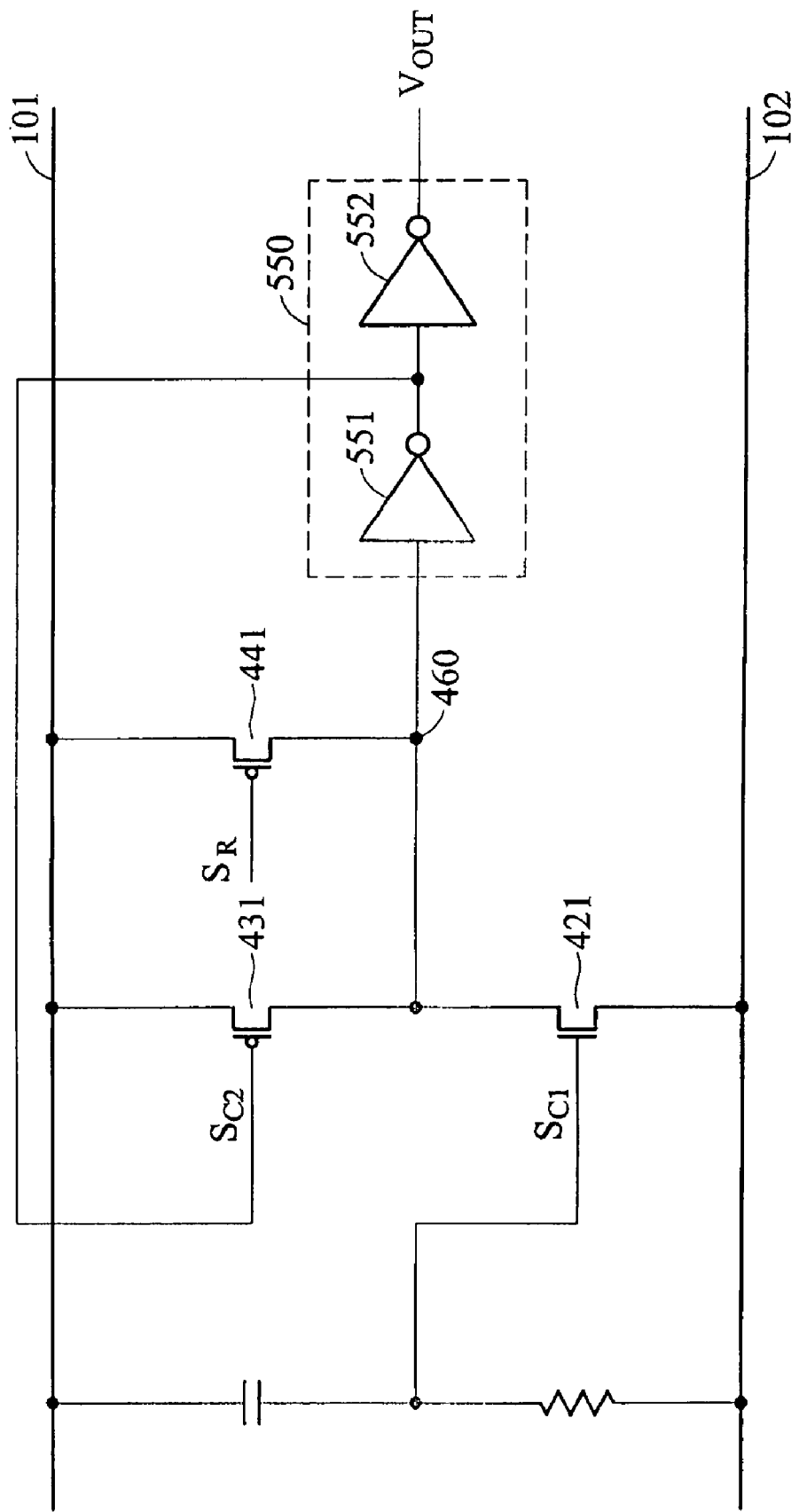

FIG. 5 is a schematic diagram of another exemplary embodiment of the transient detection circuit. FIG. 5 is similar to FIG. 4 with the exception that a control unit 550 comprises buffers 551 and 552. The buffer 551 receives the level of the node 460 and provides an output signal to serve as the control signal $S_{C2}$. The buffer 551 connects to the buffer 552 in series.

When an ESD event occurs in the power line 101 and the power line 102 is grounded, the node 460 is at a low level. Thus, the control signal $S_{C2}$ is at a high level. Assuming that the level of the power line 101 is at a high level and the level of the power line 102 is at a low level when ESD event does not occur, since the control signal $S_{C1}$ is at the low level, the N-type transistor 421 is turned off. At this time, if the reset signal $S_R$ is at the high level, the node 460 is at the low level due to the P-type transistors 431 and 441 being turned off. If the reset signal $S_R$ is at the low level, the node 460 is at the high level. Thus, the control signal $S_{C2}$ is at the low level such that the P-type transistor 431 is turned on for ensuring the node 460 at the low level.

Figure 6:
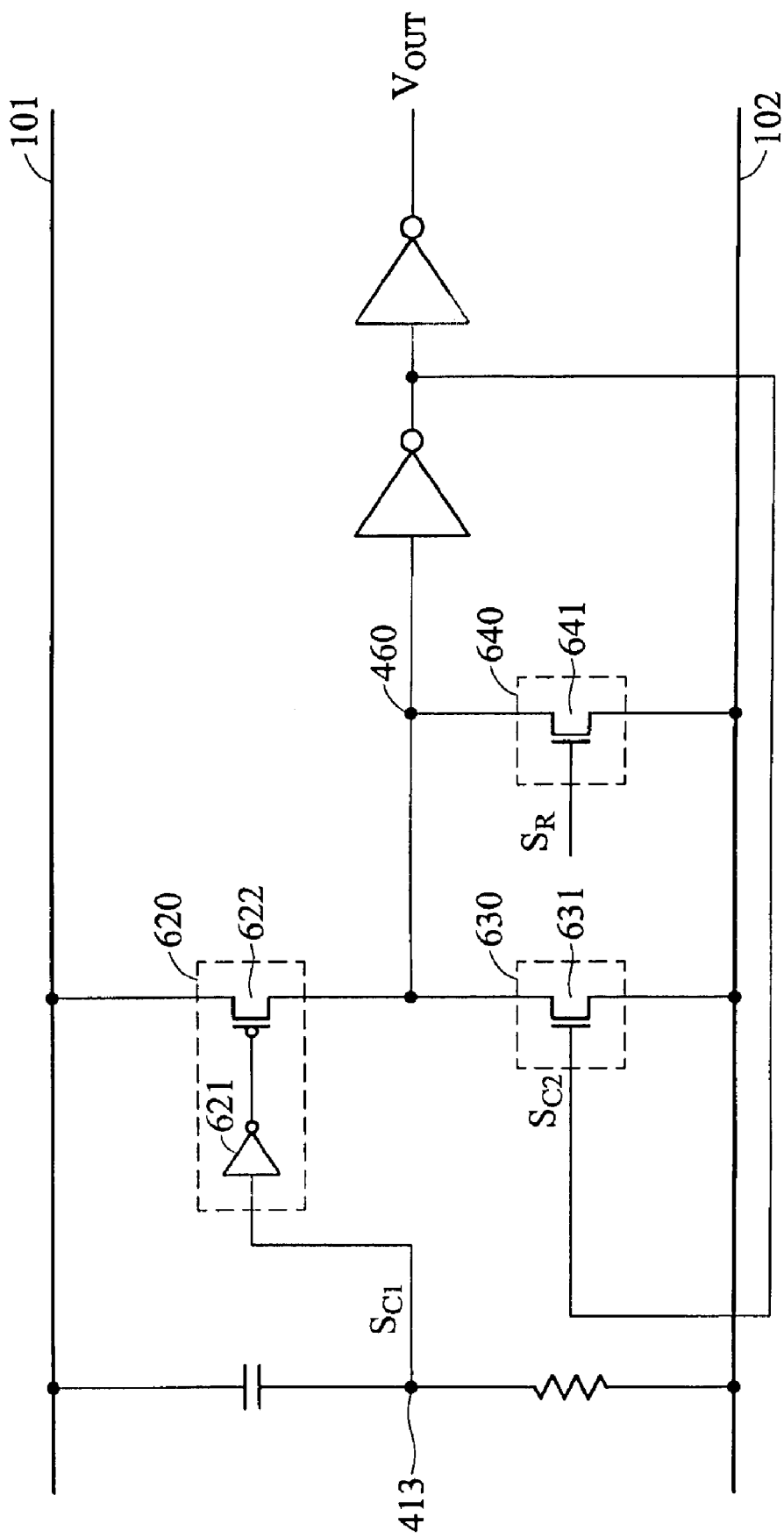

FIG. 6 is a schematic diagram of another exemplary embodiment of the transient detection circuit. The setting unit 620, the voltage regulation unit 630 and the reset unit 640 shown in FIG. 6 is different from FIG. 5. In this embodiment, the setting unit 620 comprises an inverter 621 and a P-type transistor 622. The input terminal of the inverter 621 is coupled to the node 413. The P-type transistor 622 comprises a gate coupled to the output terminal of the inverter 621, a source coupled to the power line 101, and a drain coupled to the node 460.

In this embodiment, the voltage regulation unit 630 is an N-type transistor 631 and the reset unit 640 is also an N-type transistor 641. The N-type transistor 631 sets the level of the node 460 according to the control signal $S_{C2}$. The N-type transistor 631 comprises a gate receiving the control signal $S_{C2}$, a source coupled to the power line 102, and a drain coupled to the node 460. The N-type transistor 641 comprises a gate receiving the reset signal $S_R$, a drain coupled to the node 460, and a source coupled to the power line 102.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transient detection circuit, coupled between a first power line and a second power line, comprising:
    a first control unit generating a first control signal, wherein the first control signal is at a first level when an electrostatic discharge (ESD) event occurs and the first control signal is at a second level when the ESD event does not occur;
    a reset unit resetting the level of the first node at the first level;
    a setting unit setting a first node, wherein the first node is set at the second level when the first control signal is at the first level; and
    a voltage regulation unit regulating the first node, wherein the voltage regulation unit regulates the level of the first node at the second level when the first control signal is at the second level.

2. The transient detection circuit as claimed in claim 1, further comprising a second control unit generating a second control signal to the voltage regulation unit according to the level of the first node.

3. The transient detection circuit as claimed in claim 2, wherein the voltage regulation unit is an N-type transistor comprising a gate receiving the second control signal, a drain coupled to the first node, and a source coupled to the second power line.

4. The transient detection circuit as claimed in claim 3, wherein the second control signal comprises:
    a first buffer receiving the level of the first node and providing an output signal; and
    a second buffer connected to the first buffer in series, wherein the output signal of the first buffer serves as the second control signal.

5. The transient detection circuit as claimed in claim 3, wherein the second control unit is an inverter for inverting the level of the first node and providing an inverted result to serve as the second control signal.

6. The transient detection circuit as claimed in claim 2, wherein the voltage regulation unit is a P-type transistor for setting the level of the first node according to the second control signal, and the P-type transistor comprises a gate receiving the second control signal, a source coupled to the first power line, and a drain coupled to the first node.

7. The transient detection circuit as claimed in claim 6, wherein the second control unit comprises:
    a first buffer receiving the level of the first node and providing an output signal; and
    a second buffer connected to the first buffer in series, wherein the output signal of the first buffer serves as the second control signal.

8. The transient detection circuit as claimed in claim 6, wherein the second control unit is an inverter for inverting the level of the first node and providing an inverted result to serve as the second control signal.

9. The transient detection circuit as claimed in claim 1, wherein the reset unit is an N-type transistor comprising a gate receiving a reset signal, a drain coupled to the first node, and a source coupled to the second power line.

10. The transient detection circuit as claimed in claim 1, wherein the reset unit is a P-type transistor comprising a gate receiving a reset signal, a drain coupled to the first node, and a source coupled to the first power line.

11. The transient detection circuit as claimed in claim 1, wherein the first control unit comprises:
    a resistor; and
    a capacitor coupled to the resistor in a second node and connected to the resistor in series between the first and the second power lines.

12. The transient detection circuit as claimed in claim 11, wherein the setting unit is a P-type transistor comprising a gate coupled to the second node, a source coupled to the first power line, and a drain coupled to the first node.

13. The transient detection circuit as claimed in claim 11, wherein the setting unit comprises:
    an inverter comprising an input terminal and an output terminal, wherein the input terminal is coupled to the second node; and
    an N-type transistor comprising a gate coupled to the output terminal, a source coupled to the second power line, and a drain coupled to the first node.

14. The transient detection circuit as claimed in claim 11, wherein the setting unit is an N-type transistor comprising a gate coupled to the second node, a source coupled to the second power line, and a drain coupled to the first node.

15. The transient detection circuit as claimed in claim 11, wherein the setting unit comprises:
    an inverter comprising an input terminal and an output terminal, wherein the input terminal is coupled to the first node; and
    a P-type transistor comprising a gate coupled to the output terminal, a source coupled to the first power line, and a drain coupled to the first node.

* * * * *